(12) United States Patent
Jeong et al.

(10) Patent No.: US 12,422,599 B2
(45) Date of Patent: Sep. 23, 2025

(54) LIGHT EMITTING DIODE DISPLAY DEVICE

(71) Applicant: LG DISPLAY CO., LTD., Seoul (KR)

(72) Inventors: Young-Hun Jeong, Paju-si (KR); Byung-Hyuck Seo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 509 days.

(21) Appl. No.: 18/051,257

(22) Filed: Oct. 31, 2022

(65) Prior Publication Data

US 2023/0187579 A1   Jun. 15, 2023

(30) Foreign Application Priority Data

Dec. 14, 2021   (KR) .................. 10-2021-0178707

(51) Int. Cl.
*G02B 5/04*   (2006.01)

(52) U.S. Cl.
CPC .................................. *G02B 5/045* (2013.01)

(58) Field of Classification Search
CPC .................................................... G02B 5/045
See application file for complete search history.

(56) References Cited

U.S. PATENT DOCUMENTS

2014/0301065 A1\* 10/2014 Jeong ................ G02B 19/0066
362/97.1

FOREIGN PATENT DOCUMENTS

| CN | 101639584 | \* | 2/2010 |
| CN | 101685213 | \* | 12/2014 |
| KR | 10-2016-0074860 | | 6/2016 |
| KR | 10-2020-0109740 | | 9/2020 |
| KR | 10-2021-0077259 | | 6/2021 |
| WO | WO 2007129609 | \* | 11/2007 |
| WO | WO 2010053193 | \* | 5/2010 |
| WO | WO 2017161919 | \* | 9/2017 |

\* cited by examiner

*Primary Examiner* — Mary Ellen Bowman
(74) *Attorney, Agent, or Firm* — Fish & Richardson P.C.

(57) ABSTRACT

A light emitting diode display device includes a display panel including a light emitting diode for each sub-pixel defined on a substrate, and an optical cover window positioned to correspond to a transmission direction of a light emitted from the display panel and including a plurality of pyramid patterns, wherein the plurality of pyramid patterns each include an inner bevel surface corresponding to an arrangement error of the light emitting diodes.

20 Claims, 8 Drawing Sheets

LIGHT EMITTING DIODE DISPLAY DEVICE

CROSS-REFERENCE TO RELATED APPLICATION

The present application claims the priority of Korean Patent Application No. 10-2021-0178707 filed on Dec. 14, 2021, which is hereby incorporated by reference in its entirety.

BACKGROUND

Field of the Disclosure

The present disclosure relates to a display device, and more particularly, to a light emitting diode (LED) display device that can realize a uniform luminance even when a transfer arrangement error of LEDs occurs.

Description of the Background

Recently, as a display device has become larger, a demand for a flat display device that occupies a less space has been increased, and a technology of the flat display device such as a liquid crystal display device or an organic light emitting display device including an organic light emitting diode (OLED) has been rapidly developed.

Here, in the liquid crystal display device, a backlight unit is disposed below a liquid crystal panel with polarizing plates attached to rear and front surfaces of the liquid crystal panel, and accordingly, only 5% or less of a light from a light source of the backlight unit passes through the liquid crystal panel, and there is a disadvantage in light efficiency.

In addition, in the case of the organic light emitting display device, although it has an improved luminous efficiency compared to a liquid crystal display device, there is still a limit to a luminous efficiency and still has disadvantages in durability and/or lifespan of the display device.

Accordingly, recently, in order to overcome the above problems of the liquid crystal display device and/or the organic light emitting display device, a micro-light emitting diode (micro-LED) display device has been proposed.

The micro-LED display device is a display device that implements an image by placing ultra-small LEDs (μLEDs) with a size of 100 micrometers (gym) or less in respective sub-pixels, and has great advantages in terms of low power consumption and miniaturization.

The micro-LED display device is manufactured by forming a plurality of micro-LEDs formed on a growth substrate in a process separate from a thin film transistor process of the substrate and then transferring each of the plurality of micro-LEDs onto a substrate on which thin film transistors are formed.

At this time, the transfer process needs to be conducted to precisely place the micro-LED at a desired position. However, the size of the micro-LED has recently been reduced to several tens of micrometers, so it is very difficult to precisely position the micro-LED at a desired position.

This in turn causes central luminance decrease and viewing angle asymmetry of the micro-LED display, and also causes a sharp decrease in luminance at a specific viewing angle.

SUMMARY

Accordingly, the present disclosure is directed to a light emitting diode (LED) display device that substantially obviates one or more of the problems due to limitations and disadvantages of the related art.

An advantage of the present disclosure is to provide a light emitting diode (LED) display device of large screen and high resolution which can prevent a central luminance decrease and viewing angle asymmetry from being caused.

Another advantage of the present disclosure is to provide a light emitting diode (LED) display device which can prevent a sharp decrease in luminance at a specific viewing angle.

Another advantage of the present disclosure is to provide a light emitting diode (LED) display device which can realize a uniform luminance.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a light emitting diode (LED) display device includes: a display panel including a light emitting diode for each sub-pixel defined on a substrate; and an optical cover window positioned to correspond to a transmission direction of a light emitted from the display panel and including a plurality of pyramid patterns; wherein the plurality of pyramid patterns each include an inner bevel surface corresponding to an arrangement error of the light emitting diodes.

In another aspect, a display device, comprising: a display panel includes a plurality of light emitting elements; and a lens layer, which is disposed in a transmission direction of a light emitted from the display panel and covers the display panel, and includes a plurality of pyramid lenses, wherein the plurality of pyramid lenses each include an inner bevel surface corresponding to an arrangement error of the light emitting elements. That is, although the improvement of the present disclosure is made with respect to the LED display device, the present disclosure is not limited thereto, but can be similarly applied to a general display device as long as the display device involves an arrangement error of the light emitting elements.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings.

DETAILED DESCRIPTION

Hereinafter, an aspect according to the present disclosure is described with reference to the drawings.

Figure 1:
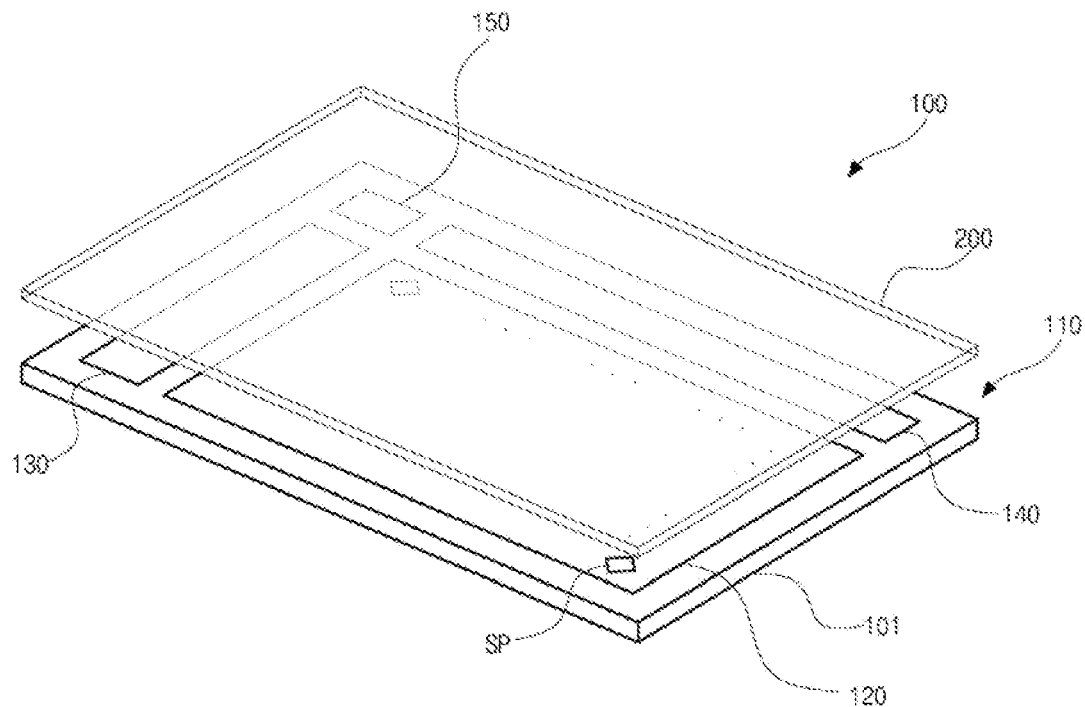
FIG. 1 is a schematic perspective view of a micro-LED display device according to an aspect of the present disclosure.

FIG. 1 is a schematic perspective view of a micro-LED display device according to an aspect of the present disclosure.

As shown in FIG. 1, the micro-LED display device 100 according to the aspect of the present disclosure may include a display panel 110 and an optical cover window 200. Note that although the micro-LED display device is exemplified as a display device in the aspects, the present disclosure is not limited thereto.

The display panel may include a pixel array 120 disposed on a substrate 101, and a gate driving circuit 130, a data driving circuit 140 and a control circuit 150 which are for driving the pixel array 120.

In the pixel array 120, a plurality of gate lines and a plurality of data lines may be located. The pixel array 120 may include a plurality of sub-pixels SP disposed at crossing regions of the gate and data lines.

In addition, a driving voltage line, a common voltage line and the like which a voltage, a signal and the like for driving the sub-pixel SP are applied may be disposed.

Figure 2:
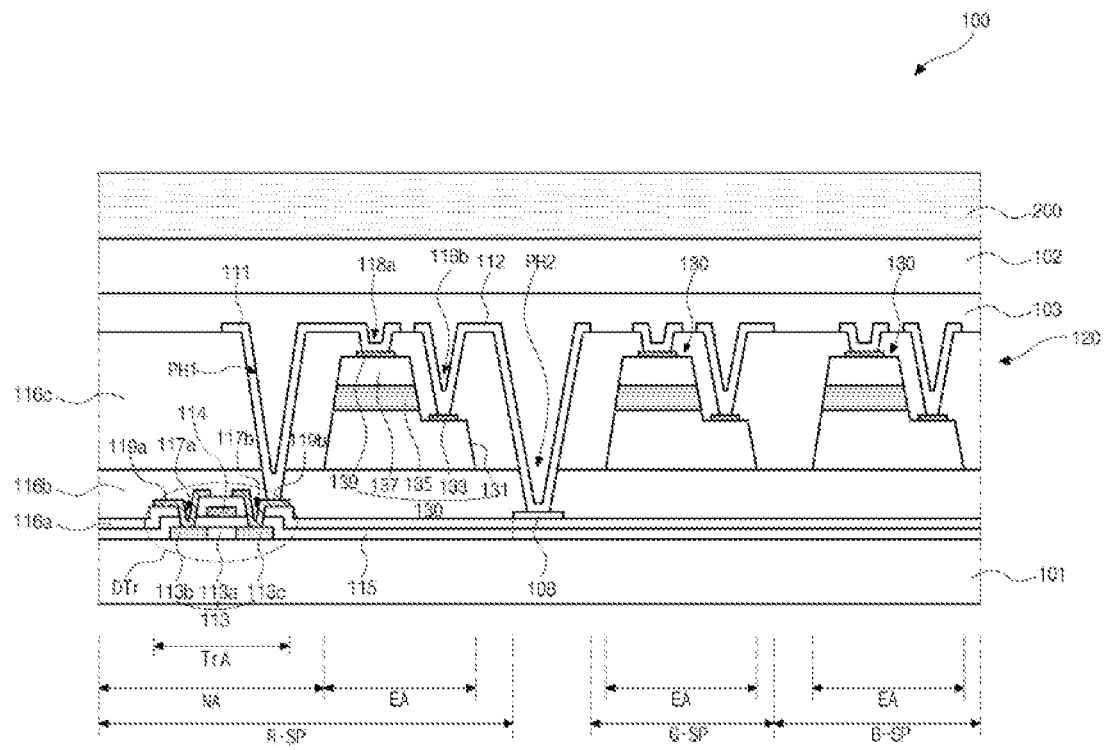
FIG. 2 is a cross-sectional view schematically illustrating a micro-LED display device according to an aspect of the present disclosure.

Each sub-pixel SP may include a light emitting element such as a micro-LED (shown as 130 of FIG. 2) for displaying an image, and one or more driving transistors for driving the micro-LED (shown as 130 of FIG. 2). This is described in more detail later. Note that although LEDs are exemplified as light emitting elements in the aspects, the present disclosure is not limited thereto.

The gate driving circuit 130 may be controlled by the control circuit 150, and may sequentially output a scan signal to a plurality of gate lines disposed in the pixel array 120 to control a driving timing of the plurality of sub-pixels SP.

The gate driving circuit 130 may include one or more gate driver integrated circuit (GDIC), and may be located at only one side or both sides of the pixel array 120 depending on a driving method.

In addition, the gate driving circuit 130 may be located on a rear surface of the pixel array 120 or the substrate 101.

The data driving circuit 140 may receive image data from the control circuit 150 and convert the image data into an analog data voltage. In addition, the data driving circuit 140 may output the data voltage to each data line according to the timing at which the scan signal is applied through the gate line, so that each sub-pixel SP may express a brightness according to the image data.

The data driving circuit 140 may include one or more source driver integrated circuit (SDIC).

The control circuit 150 may supply various control signals to the gate driving circuit 130 and the data driving circuit 140, and may control the operations of the gate driving circuit 130 and the data driving circuit 140.

The control circuit 150 may be a timing controller or a controller including the same.

Accordingly, the control circuit 150 may cause the gate driving circuit 130 to output the scan signal according to the timing implemented in each frame, and may convert the image data received from the outside to match a data signal format used by the data driving circuit 140 and output the converted image data to the data driving circuit 140.

The control circuit 150 may generate various control signals using various timing signals received from the outside and may output the various control signals to the gate driving circuit 130 and the data driving circuit 140.

The display panel 110 may further include a power management integrated circuit which supplies various voltages or currents to the pixel array 120, the gate driving circuit 130 and the data driving circuit 140, or control various voltages or currents to be supplied.

Meanwhile, the display panel 110 of the micro-LED display device 100 may be implemented by transferring the micro-LEDs (130 of FIG. 2) grown on a separate wafer substrate to the sub-pixels SP of the pixel array 120 defined on the substrate 101.

At this time, the micro-LED display device 100 according to the aspect of the present disclosure may be characterized in that the optical cover window 200 is positioned in front of the display panel 110 in correspondence to a transmission direction of light emitted from the micro-LED (130 of FIG. 2).

Accordingly, in the micro-LED display device 100 according to the aspect of the present disclosure, even if an arrangement error of the micro-LEDs (130 of FIG. 2) that may occur in a process of transferring the micro-LEDs (130 of FIG. 2) onto the substrate 101 occurs, it is possible to prevent central luminance decrease and viewing angle asymmetry of the micro-LED display device 100 from being caused.

In addition, it is also possible to prevent a sharp luminance decrease at a specific viewing angle.

This is described in more detail with reference to the drawings below.

FIG. 2 is a cross-sectional view schematically illustrating a micro-LED display device according to an aspect of the present disclosure, showing three sub-pixels of the micro-LED display device.

Figure 3:
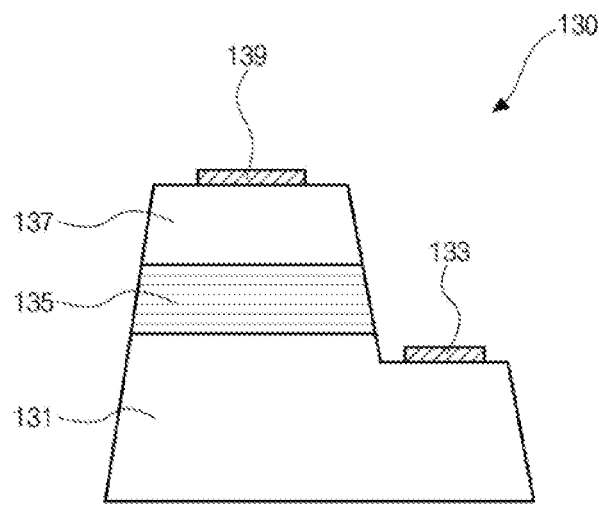
FIG. 3 is a cross-sectional view schematically illustrating a micro-LED of FIG. 2.

FIG. 3 is a cross-sectional view schematically illustrating a micro-LED of FIG. 2.

Prior to the description, even though each of the sub-pixels R-SP, G-SP and B-SP defined on the substrate 101 are provided with a driving thin film transistor DTr and a switching thin film transistor (not shown), for convenience of explanation and for conciseness of drawings, the driving thin film transistor DTr is illustrated in only one sub-pixel R-SP.

As shown in FIG. 2, the micro-LED display device 100 may include the display panel 110 (shown in FIG. 1 and only a part of the structure of the display panel being shown in FIG. 2) and the optical cover window 200. If a direction in the drawing is defined for convenience of explanation, on the premise that a display surface of the display panel 110 faces forward, the optical cover window 200 is disposed in front of the display panel 110.

In more detail, a plurality of sub-pixels R-SP, G-SP and B-SP may be defined on the substrate 101 of the display panel 110. Each of the plurality of sub-pixels R-SP, G-SP and B-SP may be defined by a cross structure of the gate and data line, but is not limited thereto.

Each of the sub-pixels R-SP, G-SP and B-SP may include an emission area EA corresponding to the micro-LED 130, and a non-emission area NA may be formed along an edge of the emission area EA.

In addition, a switching area TrA in which the driving thin film transistor DTr is formed may be defined at one side of the non-emission area NA. A semiconductor layer 113 may be positioned on the switching area TrA. The semiconductor layer 113 may be made of silicon (Si) or an oxide material, and may include an active region 113*a* located at a central portion thereof and forming a channel, and source and drain regions 113*b* and 113*c* doped with a high concentration of impurities on both sides of the active region 113*a*.

A gate insulating layer 115 may be positioned on the semiconductor layer 113.

A gate electrode 114 may be provided on the gate insulating layer 115 to correspond to the active region 113*a* of the semiconductor layer 113. In this disclosure, a top gate type thin film transistor in which the gate electrode 114 is positioned on the gate insulating layer 115 and the semiconductor layer 113 is positioned below the gate insulating layer 115 is described, but this disclosure is not limited thereto. For example, a bottom gate type thin film transistor in which the gate electrode 114 is positioned below the gate insulating layer 115 and the semiconductor layer 113 is positioned on the gate insulating layer 115 may be used.

In addition, a first inter-layered insulating layer 116*a* may be positioned on the gate electrode 114. In this case, the first inter-layered insulating layer 116*a* and the gate insulating layer 115 therebelow may include first and second semiconductor layer contact holes 117*a* and 117*b* respectively exposing the source and drain regions 113*b* and 113*c* located on both sides of the active region 113*a*.

Source and drain electrodes 119*a* and 119*b* that are spaced apart from each other and respectively contact the source and drain regions 113*b* and 113*c* exposed through the first and second semiconductor layer contact holes 117*a* and 117*b* may be provided on the first inter-layered insulating layer 116*a* including the first and second semiconductor layer contact holes 117*a* and 117*b*.

The source electrode 119*a* may be connected to the data line, and a common voltage line 108 may be further formed on the first inter-layered insulating layer 116*a* in parallel to the data line.

Optionally, one common voltage line 108 may be provided for each of the plurality of unit pixels. In this case, at least three sub-pixels R-SP G-SP, and B-SP constituting each unit pixel may share one common voltage line 108. Accordingly, the number of the common voltage lines 108 for driving each of the sub-pixels B-SP, G-SP and R-SP can be reduced, and an aperture ratio of each unit pixel may be increased or a size of each unit pixel may be decreased by the number of the reduced common voltage lines 108.

A second inter-layered insulating layer 116*b* may be positioned on the source and drain electrodes 119*a* and 119*b*, the common voltage line 108, and the first inter-layered insulating layer 116*a* exposed between the two electrodes 119*a* and 119*b*.

At this time, the source and drain electrodes 119*a* and 119*b*, the semiconductor layer 113 including the source and drain regions 113*b* and 113*c* in contact with the source and drain electrodes 119*a* and 119*b*, and the gate insulating layer 115 and the gate electrode 114 positioned on the semiconductor layer 113 may form the driving thin film transistor DTr.

In addition, the switching thin film transistor (not shown) may have the same structure as the driving thin film transistor DTr and may be electrically connected to the driving thin film transistor DTr.

Here, in the drawings, the switching thin film transistor (not shown) and the driving thin film transistor (DTr) being configured as a top gate type thin film transistor as an example in which the semiconductor layer 113 is made of a silicon semiconductor layer or an oxide semiconductor layer is shown by way of example, but as a modification thereof, it may be configured as a bottom gate type.

In addition, the micro-LED 130 may be positioned on the second inter-layered insulating layer 116*b* to correspond to the emission area EA for each of the sub-pixels R-SP, G-SP and B-SP. The micro-LED 130 may be disposed on the second inter-layered insulating layer 116*b* using an adhesive member (not shown).

Here, referring to the structure of the micro-LED 130 in more detail with reference to FIG. 3, each micro-LED 130 may include an n-type electrode 133, a light emitting layer and a p-type electrode 139.

The light emitting layer may emit a light through recombination of electrons and holes according to a current flowing between the n-type electrode 133 and the p-type electrode 139. The light emitting layer may include a first semiconductor layer 131, an active layer 135 and a second semiconductor layer 137.

The second semiconductor layer 137 may provide holes to the active layer 135. The second semiconductor layer 137 may be made of a p-GaN-based semiconductor material, and the p-GaN-based semiconductor material may be GaN (gallium nitride), AlGaN (aluminum gallium nitride), InGaN (indium gallium nitride), or AlInGaN (aluminum indium gallium nitride). Here, as an impurity used for doping the second semiconductor layer 137, Mg (magnesium), Zn (zinc), or Be (beryllium) may be used.

The active layer 135 positioned below the second semiconductor layer 137 may have a multi-quantum well (MQW) structure having a well layer and a barrier layer having a higher band gap than the well layer.

The active layer 135 may have a multi-quantum well structure such as InGaN/GaN.

The first semiconductor layer 131 positioned below the active layer 135 may serve to provide electrons to the active layer 135. The first semiconductor layer 131 may be made of an n-GaN-based semiconductor material, and the n-GaN-based semiconductor material may be GaN (gallium nitride), AlGaN (aluminum gallium nitride), InGaN (indium gallium nitride), or AlInGaN (aluminum indium gallium nitride). Here, as an impurity used for doping the first semiconductor layer 131, Si (silicon), Ge (germinium), Se (selenium), Te (tellurium), or C (carbon) may be used.

The p-type electrode 139 may be provided on the second semiconductor layer 137, and the p-type electrode 139 may be used as a cathode providing holes to the second semiconductor layer 137. The n-type electrode 133 may be provided on the other side of the first semiconductor layer 131 so as to be electrically separated from the active layer 135 and the first semiconductor layer 131, and the n-type electrode 133 may be used as an anode providing electrons to the first semiconductor layer 131.

In this case, each of the n-type electrode 133 and the p-type electrode 139 may be formed of a conductive transparent material or conductive reflective material according to the light emission direction of the micro-LED 130. As an example, the conductive transparent material may be indium tin oxide (ITO) or indium zinc oxide (IZO), but is not limited thereto. The conductive reflective material may be one or more of metal materials, such as Au (gold), W (tungsten), Pt (platinum), Si (silicon), Ir (iridium), Ag (silver), Cu (copper), Ni (nickel) and Ti (titanium), and alloys thereof, but is not limited thereto.

Accordingly, in the case of a bottom emission structure in which a light emitted from the micro-LED 130 proceeds toward the substrate 101, each of the n-type electrode 133 and the p-type electrode 139 may be made of a conductive reflective material. In the case of a top emission structure in which a light emitted from the micro-LED 130 proceeds in a direction opposite to the substrate 101, each of the n-type electrode 133 and the p-type electrode 139 may be made of a transparent conductive material.

Hereinafter, a top emission structure is described as an example, and therefore, each of the n-type electrode 133 and the p-type electrode 139 being made of a conductive transparent material is described as an example.

The micro-LED 130 may emit a light through recombination of electrons and holes according to the current flowing between the n-type electrode 133 and the p-type electrode 139.

A reflective pattern (not shown) may be further positioned between the first semiconductor layer 131 of the micro-LED 130 and the second inter-layered insulating film 116b, and an insulating pattern (not shown) may be positioned between the reflective pattern and the first semiconductor layer 131.

The reflective pattern may reflect upward a light emitted toward the substrate 101 among a light emitted from the micro-LED 130, thereby improving a light efficiency of the micro-LED 130.

A third inter-layered insulating layer 116c may be positioned on the micro-LED 130 positioned for each of the sub-pixels R-SP, G-SP and B-SP. The third interlayer insulating layer 116c along with the second inter-layered insulating layer 116b may include a drain contact hole PH1 exposing the drain electrode 119b of the driving thin film transistor DTr and a common contact hole PH2 exposing the common voltage line 108.

In addition, the third inter-layered insulating layer 116c may include first and second electrode contact holes 118a and 118b respectively exposing the p-type electrode 139 and the n-type electrode 133 of the micro-LED 130 positioned for each of the sub-pixels R-SP, G-SP and B-SP. On the third inter-layered insulating layer 116c, a first connection electrode 111 which electrically connects the drain electrode 119b of the driving thin film transistor DTr exposed through the drain contact hole PH1 to the p-type electrode 139 of the micro-LED 130 exposed through the first electrode contact hole 118a, and a second connection electrode 112 which electrically connects the common voltage line 108 exposed through the common contact hole PH2 to the n-type electrode 133 of the micro-LED 130 exposed through the second electrode contact hole 118b may be positioned.

In order to transmit a light emitted from the active layer 135 of the micro-LED 130, all of the first and second connection electrodes 111 and 112 may be a transparent conductive oxide such as indium tin oxide (ITO), indium zinc oxide (IZO), indium tin zinc oxide (ITZO), zinc oxide (ZnO) and tin oxide (TO) transparent conductive oxides, but is not limited thereto.

Accordingly, the p-type electrode 139 of the micro-LED 130 may be electrically connected to the drain electrode 119b of the driving thin film transistor DTr through the first connection electrode 111. The n-type electrode 133 of the micro-LED 130 may be electrically connected to the common voltage line 108 through the second connection electrode 112 so that the micro-LED 130 positioned in each of the sub-pixels R-SP, G-SP and B-SP may emit a light.

In this case, a combination of the sub-pixels R-SP, G-SP and B-SP may define one unit pixel, and each of the sub-pixels R-SP, G-SP and B-SP may emit light of various colors.

In other words, the sub-pixels R-SP, G-SP and B-SP may include a red sub-pixel R-SP, a green sub-pixel G-SP and a blue sub-pixel B-SP. A red light may be emitted from the emission area EA of the red sub-pixel R-SP, a green light may be emitted from the emission area EA of the green sub-pixel G-SP, and a blue light may be emitted from the emission area EA of the blue sub-pixel B-SP, but it is not limited thereto.

In addition, the micro-LEDs 130 positioned corresponding to the emission areas EA of the sub-pixels R-SP, G-SP and B-SP may emit different lights or lights of the same color. For example, when the micro-LEDs 130 emit different color lights, the micro-LED 130 located in the red sub-pixel R-SP emits a red light, the micro-LED 130 located in the green sub-pixel G-SP emits a green light, and the micro-LED 130 located in the blue sub-pixel B-SP emits a blue light.

In addition, the micro-LED 130s positioned corresponding to the emission areas EA of the sub-pixels R-SP, G-SP and B-SP may all emit lights of the same color. By using a light conversion member such as a light conversion layer on each micro-LED 130 in each of the sub-pixels R-SP, G-SP and B-SP, a light emitted from each micro-LED 130 may be converted into a light of various colors.

Here, the light conversion member may be positioned to correspond to each of the sub-pixels R-SP, G-SP and B-SP. The light conversion member may be implemented by placing a photoacrylic, silicon oxide (SiOx) or silicon nitride (SiNx) in which a light conversion material such as a nano phosphor, organic phosphor or quantum dot is distributed on each micro-LED 130 by an inkjet printing or dotting.

After placing an encapsulation substrate 102 in a form of a thin film on the driving thin film transistor DTr and the micro-LED 130, a transparent buffer layer 103 may be interposed between the micro-LED 130 and the encapsulation substrate 102 to bond the encapsulation substrate 102 and the substrate 101, thereby encapsulating the display panel 110.

The transparent buffer layer 103 may be provided on the substrate 101 so as to cover all of the third inter-layered insulating layer 116c, thereby providing a flat surface on the third inter-layered insulating layer 116c and protecting the micro-LED 130 and the driving thin film transistor (DTr) from an external impact.

The transparent buffer layer 103 may be made of optical clear adhesive (OCA) or optical clear resin (OCR), but is not limited thereto.

Here, the micro-LED display device 100 according to the aspect of the present disclosure may be characterized in that the optical cover window 200 is positioned in front of the display panel 110 in correspondence to the light transmission direction of the light emitted through the micro-LED 130 of the display panel 110. The optical cover window 200 may include a pyramid pattern (210 of FIG. 4) including inner bevel surfaces (213a, 213b, 213c, and 213d of FIG. 5B) corresponding to an arrangement error range of the micro-LED 130 that may occur in a process of transferring the micro-LED 130 onto the substrate 101.

In more detail, in the micro-LED display device 100, a micro-LED may be transferred for each of the sub-pixels R-SP, G-SP and B-SP on the substrate 101 provided with the driving thin film transistor DTr. The micro-LED 130 may be epitaxially grown on a wafer substrate made of at least one of sapphire, SiC, Si (silicon), GaAs (gallium arsenide), GaN (gallium nitride), ZnO (zinc oxide), GaP (gallium phosphorus), InP (indium phosphorus), Ge (germanium), and $Ga_2O_3$ (gallium oxide), and may be transferred onto the substrate 101 and be disposed for each of the sub-pixels R-SP, G-SP and B-SP.

Here, the micro-LED 130 may generally have a size of 5 µm to 100 µm, and it is very difficult to precisely locate this micro-LED 130 at a desired position. Accordingly, in a process of transferring or assembling the micro-LED 130, an arrangement error of the micro-LED 130 occurs.

Such the arrangement error of the micro-LED 130 causes central luminance decrease and viewing angle asymmetry of the micro-LED display device 100, and also causes a sharp luminance decrease at a specific viewing angle.

Therefore, in the micro-LED display device 100 according to the aspect of the present disclosure, the optical cover window 200 may be positioned in front of the display panel 110 in correspondence to the light transmission direction of the light emitted through the micro-LED 130 of the display panel 110 and may include the pyramid pattern (210 of FIG. 4) including the inner bevel surfaces (213a, 213b, 213c, and 213d of FIG. 5B) corresponding to the arrangement error range, thereby compensating for luminance degradation and uniformity caused by the arrangement error of the micro-LED 130.

Therefore, even if the arrangement error of the micro-LED 130 occurs, it is possible to prevent central luminance decrease and viewing angle asymmetry of the micro-LED display device 100 from being caused and to prevent a sharp luminance decrease at a specific viewing angle from being caused.

Figure 4:
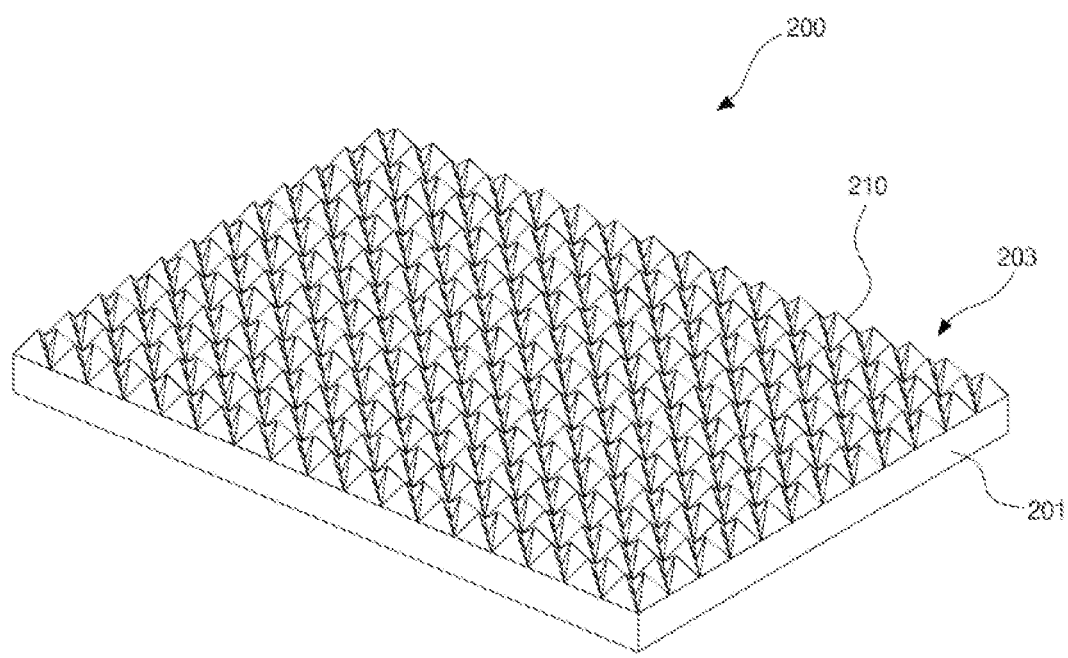
FIG. 4 is a perspective view schematically illustrating an optical cover window according to an aspect of the present disclosure.
Figure 5A:
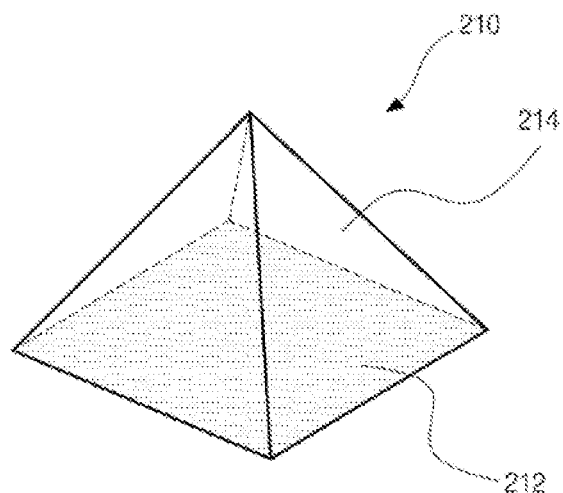
FIGS. 5A to 5C are perspective and plan views schematically illustrating a pyramid pattern of an optical cover window.
Figure 5B:
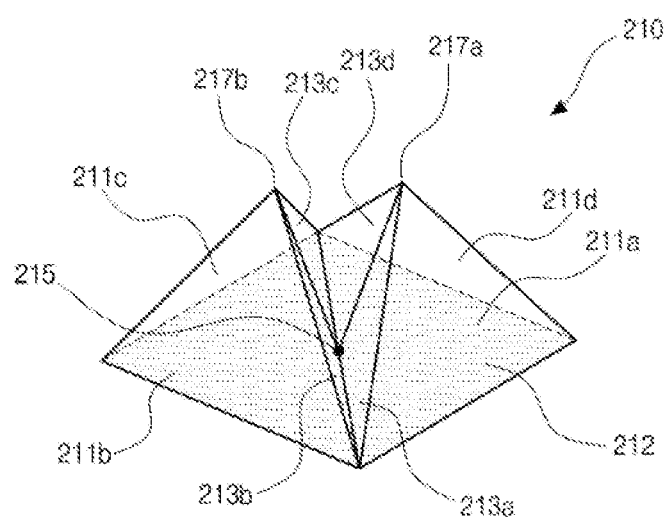
Figure 5C:
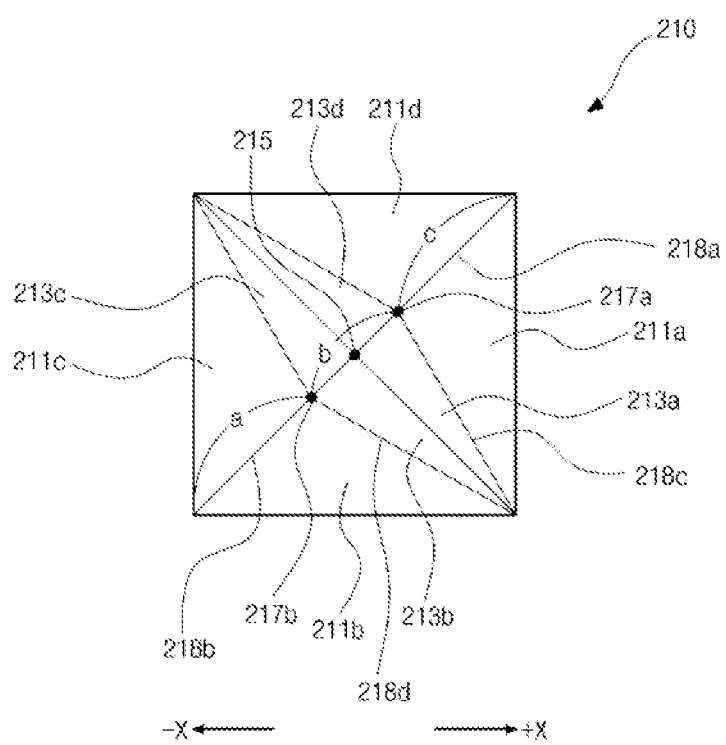

FIG. 4 is a perspective view schematically illustrating an optical cover window according to an aspect of the present disclosure, and FIGS. 5A to 5C are perspective and plan views schematically illustrating a pyramid pattern of an optical cover window.

FIGS. 6A to 6F are cross-sectional views schematically illustrating designing a pyramid pattern by reflecting an arrangement error of a micro-LED according to an aspect of the present disclosure.

As shown in FIG. 4, the optical cover window 200 may include a lens layer 203, positioned on a base film 201 which is optional and can be omitted.

The base film 201 may be a component which maintains an overall strength of the optical cover window 200 and a surface of which a lens layer 203 is formed on. The lens layer 203 may include a plurality of pyramid patterns 210 distributed to be spaced apart from each other, and these pyramid patterns 210 may be also referred to as pyramid lenses. The pyramid pattern 210 may protrude from one surface of the base film 201.

At this time, the plurality of pyramid patterns 210 may be arranged adjacent to each other in a longitudinal direction and a transverse directions of the base film 201, and may be closely arranged so that there is no empty space between the adjacent pyramid patterns 210.

Here, the base film 201 and the lens layer 203 may be made of a transmissive material capable of transmitting a light. Since the optical cover window 200 is located in front of the display panel (110 of FIG. 2) in correspondence to the transmission direction of a light emitted through the micro-LED (130 of FIG. 2) of the display panel (110 of FIG. 2), the base film 201 and the lens layer 203 may have low light scattering and high transparency in visible light region.

For example, the base film 201 and the lens layer 203 may be made of polyester, polyacrylic, polyvinyl chloride, polycarbonate, polymethyl methacrylate, polystyrene, polyester sulfone, polybutadiene, triacetate cellulose film (TAC), cycloolefin polymer (COP), polyethylene terephthalate (PET) or an acrylic film, but is not limited thereto.

As the optical cover window 200 is disposed at an outermost part of the micro-LED display device (100 of FIG. 2), the optical cover window 200 may have a minimum thickness within a limit having rigidity to protect the display panel (110 of FIG. 2) from an external impact and thus has a higher transparency.

That is, the optical cover window 200 may have a thickness of 20 µm to 80 µm, and when having a thickness of 50 µm, the optical cover window 200 can implement both rigidity and high transparency.

In addition, the optical cover window 200 may have a refractive index of 1.0 or more and 1.54 or less and thus has a high transparency without haze characteristics. The haze characteristic may be defined as an opaque phenomenon (e.g., blurring phenomenon) in which when a light passes through a transparent material, the light is diffused according to an intrinsic property of a material.

That is, by forming a refractive index of the optical cover window 200 to be greater than 1.0 which is a refractive index of an air, while a light emitted from the micro-LED (130 of FIG. 2) passing through the optical cover window 200 and being refracted into the air, the light is prevented from being refracted and diffused. Furthermore, when the refractive index of the optical cover window 200 is 1.54 or more, the optical cover window 200 has a haze characteristic. Therefore, the optical cover window 200 may have a refractive index of 1.0 or more and 1.54 or less.

In addition, in the optical cover window 200 of the present disclosure, a size of the pyramid pattern 210 of the lens layer 203 may be set to 50 µm or less and thus the haze characteristic is not generated.

TABLE 1

| Size (µm) | Luminance(%) |
|---|---|
| 60 | 100 |
| 50 | 100 |
| 40 | 99 |
| 30 | 97 |
| 25 | 96 |
| 20 | 94 |
| 10 | 90 |
| 5 | 70 |

Table 1 shows an experimental result of measuring a luminance to a size change of the pyramid pattern 210 of the optical cover window 200. The optical cover window 200 used in the experiment is made of polyethylene terephthalate (PET) and has a thickness of 50 µm.

In Table 1, the luminance indicates an amount of an output light measured after positioning the optical cover window 200 in front of the display panel (110 of FIG. 2) in correspondence to the transmission direction of a light emitted from the micro-LED (130 of FIG. 2).

At this time, an area of each of the sub-pixels (R-SP, G-SP and B-SP of FIG. 2) of the micro-LED display device (100 of FIG. 2) is 50 µm, and when the size of the pyramid pattern 210 is designed to be the same as the area of each of the sub-pixel (R-SP, G-SP and B-SP of FIG. 2), the luminance is defined as 100%.

In the above Table 1, it can be seen that as the size of the pyramid pattern 210 of the optical cover window 200 increases, the overall luminance of the micro-LED display device (100 in FIG. 2) is improved. When the size of the pyramid pattern 210 is similar to or larger than the area of each of the sub-pixels (R-SP, G-SP and B-SP of FIG. 2) of the micro-LED display device (100 in FIG. 2), the pyramid pattern 210 overlaps with each of the sub-pixels (R-SP, G-SP and B-SP of FIG. 2), and thus a moire phenomenon may occur.

Therefore, the size of the pyramid pattern 210 may be smaller than the area of each of the sub-pixels (R-SP, G-SP and B-SP of FIG. 2) of the micro-LED display device (100 in FIG. 2).

In addition, as the size of the pyramid pattern 210 decreases, the optical cover window 200 has a haze characteristic, so that the luminance may decrease. Therefore, the size of the pyramid pattern 210 may be larger than 25 μm and smaller than 50 μm in order to prevent both luminance degradation and moire phenomenon.

The optical cover window 200 according to the aspect of the present disclosure may have a thickness of 20 μm to 80 μm, alternatively a thickness of 50 μm. In addition, the optical cover window 200 may have a refractive index of 1.0 or more and 1.54 or less, and the size of the pyramid pattern 210 of the lens layer 203 may be greater than 25 μm and smaller than 50 μm. By forming the optical cover window 200 in this way, a luminance decrease can be prevented, and a moire phenomenon can also be removed or reduced.

Accordingly, as the optical cover window 200 according to the aspect of the present disclosure in the outermost part of the micro-LED display device (100 of FIG. 2), the optical cover window 200 can protects the display panel (110 of FIG. 2) from an external impact, and the optical cover window has a high transparency and can thus secure a beautiful appearance without visual distortion.

The pyramid pattern 210 of the lens layer 203 according to the aspect of the present disclosure reflects an arrangement error of the micro-LED (130 of FIG. 2), which may occur in a process of transferring the micro-LED (130 of FIG. 2) onto the substrate (101 of FIG. 2), so that it can have various shapes.

Here, the pyramid pattern 210 serves to guide a light to a front, and to guide a light incident to a predetermined region to a side.

Accordingly, the micro-LED display device (100 of FIG. 2) according to the aspect of the present disclosure can prevent central luminance decrease and viewing angle asymmetry from occurring. In addition, according to the aspect of the present disclosure, it is also possible to prevent a luminance from being sharply lowered at a specific viewing angle.

Referring to FIG. 5A, when the micro-LED (130 of FIG. 2) is accurately transferred to a desired position on the substrate (101 of FIG. 2), the pyramid pattern 210 of the optical cover window 200 may include a lower surface 212 formed of a square, and four side surfaces 214 respectively extending from edges of the lower surface 212 to form one corner.

Here, a base angle θ between each side surface 214 and the lower surface 212 of the pyramid pattern 210 may vary depending on the size of the pyramid pattern 210.

At this time, since the size of the pyramid pattern 210 is larger than 25 μm and smaller than 50 μm to prevent a decrease in luminance and also to remove a moire phenomenon, the four side surfaces 214 can be made at various angles according to the size of the pyramid pattern 210 within a limit that can form one corner in a pyramid form from the lower surface 212 of a square.

For example, when the pyramid pattern 210 has a size of 50 μm, each of the side surfaces 214 may form a base angle θ of 45° with the lower surface 212, and all of the side surfaces 214 may be symmetrical.

Referring to FIGS. 5B and 5C, when an arrangement error of the micro-LEDs (130 of FIG. 2) occurs in a process of transferring the micro-LEDs (130 of FIG. 2), the pyramid pattern 210 of the lens layer 203 according to the aspect of the present disclosure may have a lower surface 212 formed of a square, first to fourth outer surfaces 211a, 211b, 211c and 211d respectively extending from edges of the lower surface 212 to a top of the pyramid pattern 210, and first to fourth inner bevel surfaces 213a, 213b, 213c and 213d which are connected to the first to fourth outer surfaces 211a, 211b, 211c and 211d to form a central point corner 215 corresponding to a central portion of the lower surface 212 are formed.

At this time, between the first outer surface 211a and the second outer surface 211b, the first inner bevel surface 213a facing the first outer surface 211a and the second inner bevel surface 213b facing the second outer surface 211b may be positioned, so that the first outer surface 211a, the first inner bevel surface 213a, the second inner bevel surface 213b and the second outer surface 211b form a mountain and a valley.

Third and fourth outer surfaces 211c and 211d may be provided adjacent to the second outer surface 211b and the first outer surface 211a, respectively. In this case, between the third outer surface 211c and the fourth outer surface 211d, the third inner bevel surface 213c facing the third outer surface 211c and the fourth inner bevel surface 213d facing the fourth outer surface 211d may be positioned.

Accordingly, the second outer surface 211b and the third outer surface 211c form a mountain and the first outer surface 211a and the fourth outer surface 211d form a mountain. The third outer surface 211c and the third inner bevel surface 213c form a mountain and the fourth outer surface 211d and the fourth inner bevel surface 213d form a mountain. The third inner bevel surface 213c and the fourth inner bevel surface 213d form a valley. Accordingly, the third outer surface 211c, the third inner bevel surface 213c, the fourth inner bevel surface 213d and the fourth outer surface 211d form a mountain and a valley.

At this time, a height h1 of a first corner 217a formed by the first and fourth outer surfaces 211a and 211d and the first and fourth inner bevel surfaces 213a and 213d may be determined by reflecting an arrangement error when the arrangement error of the micro-LED 130 of FIG. 2 occurs in a +X axis direction defined in the drawing. In addition, a height h2 of a second corner 217b formed by the second and third outer surfaces 211b and 211c and the second and third inner bevel surfaces 213b and 213c may be determined by reflecting an arrangement error when the arrangement error of the micro-LED 130 of FIG. 2 occurs in a −X axis direction defined in the drawing.

Therefore, in the optical cover window 200 according to the aspect of the present disclosure, the heights h1 and h2 of the first and second corners 217a and 217b of the pyramid pattern 210 of the lens layer 203 may be equal to or different from each other depending on the arrangement error of the micro-LED (130 of FIG. 2) transferred onto the substrate (101 of FIG. 2).

Here, the arrangement error of the micro-LED (130 of FIG. 2) may be designed by setting an average value of positioning errors in repeated arrangement in a process of transferring the micro-LED (130 of FIG. 2).

This is described in more detail with reference to FIGS. 6A to 6F.

FIGS. 6A to 6F are cross-sectional views schematically illustrating designing a pyramid pattern by reflecting an arrangement error of a micro-LED according to an aspect of the present disclosure.

Here, referring to FIG. 5C, the pyramid pattern 210 according to the aspect of the present disclosure is described in more detail. In the pyramid pattern 210, the first outer surface 211a and the fourth outer surface 211d may form a first corner surface 218a, the first outer surface 211a and the first inner bevel surface 213a may form a third corner surface 218c.

In addition, the second outer surface 211b and the third outer surface 211c may form a second corner surface 218b, and the second outer surface 211b and the second inner bevel surface 213b may form a fourth corner surface 218d.

Figure 6A:
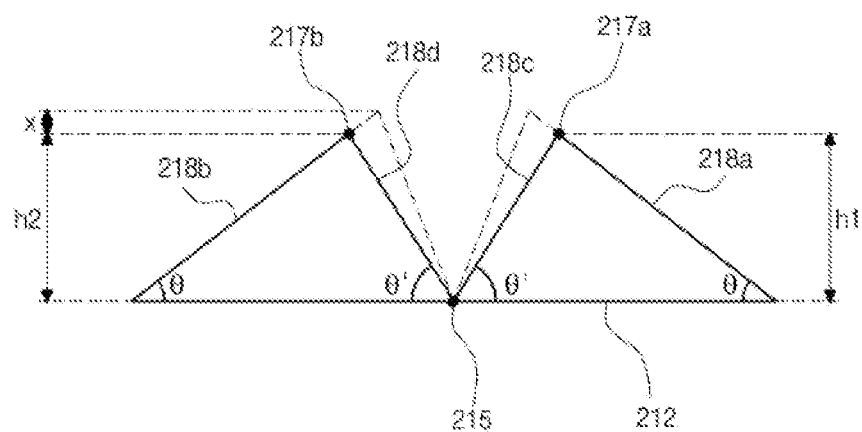
FIGS. 6A to 6F are cross-sectional views schematically illustrating designing a pyramid pattern by reflecting an arrangement error of a micro-LED according to an aspect of the present disclosure.

At this time, when an arrangement error of the micro-LED (130 of FIG. 2) in the transfer process occurs by 2 μm in the +X axis direction defined in the drawing, as shown in FIG. 6A, in the case that the size of the pyramid pattern 210 is 50 μm, the second corner surface 218b of the pyramid pattern 210 forms a base angle θ of 45° with the lower surface 212, but the fourth corner surface 218d forms a base angle θ' greater than 45° with the lower surface 212. Thus, the second corner surface 218b and the fourth corner surface 218d are asymmetric to each other.

At this time, the height h2 of the second corner 217b formed by the gathering of the second corner surface 218b and the fourth corner surface 218d is formed to be lowered by 2 μm, which is the arrangement error x of the micro-LED (130 of FIG. 2), along the length direction of the second corner surface 218b. Thus, the fourth corner surface 218d is formed to have the base angle θ' greater than 45° with the lower surface 212, and the second corner surface 218b and the fourth corner surface 218d are asymmetric with each other.

Here, when the arrangement error x of the micro-LED (130 of FIG. 2) is repeatedly generated in one direction all at once, the height h1 of the first corner 217a formed by the first outer surface 211a and the first inner bevel surface 213a is also formed to be lowered by 2 μm along the length direction of the first corner surface 218a, so that the first inner bevel 213a and the second inner bevel 213b are symmetrical to each other.

Figure 6B:
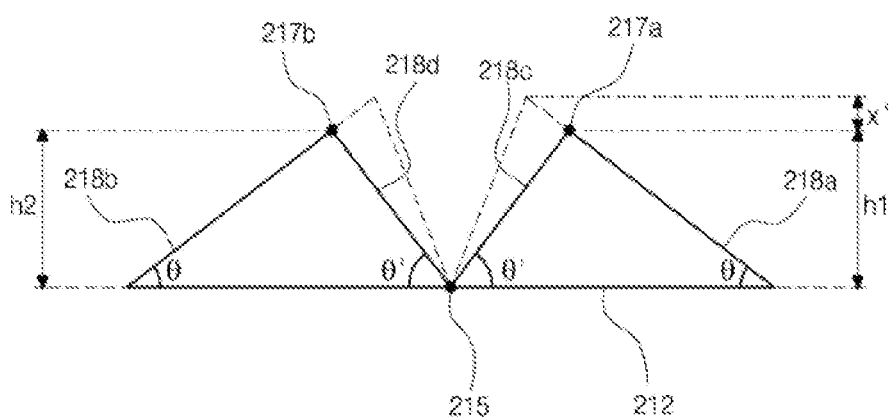

In addition, when the arrangement error x' of the micro-LED (130 of FIG. 2) occurs by 4 μm in the −X axis direction defined in the drawing, as shown in FIG. 6B, the height h1 of the first corner 217a formed by the gathering of the first corner surface 218a and the third corner surface 218c of the pyramid pattern 210 is formed to be lowered by 4 μm, which is the arrangement error x' of the micro-LED (130 of FIG. 2), along the length direction of the first corner surface 218a. Thus, the first corner surface 218a is formed to have the base angle θ of 45° with the lower surface 212, but the third corner surface 218c is formed to have the base angle θ' greater than 45° with the lower surface 212, so that the first corner surface 218a and the third corner surface 218c are asymmetric to each other.

At this time, the height h2 of the second corner 217b formed by the second outer surface 211b and the second inner bevel surface 213b is also formed to be lowered by 4 μm in the length direction of the second corner surface 218b, so that the first inner bevel surface 213a and the second inner bevel surface 213b are formed to be symmetrical with each other.

Figure 6C:
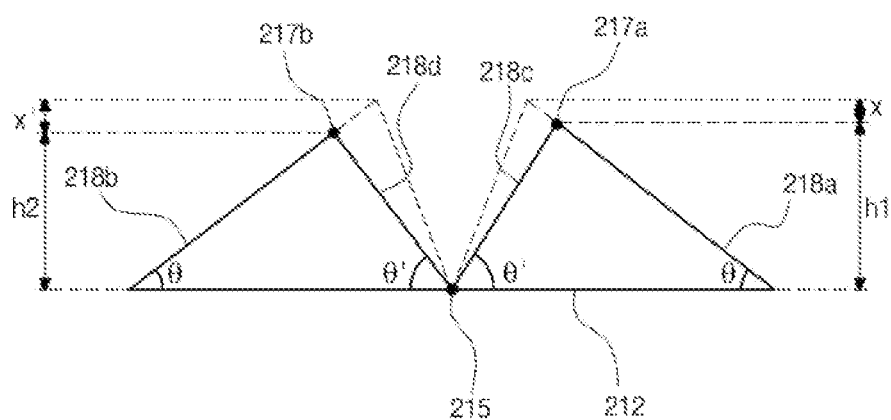

Alternatively, when the arrangement errors x and x' of the micro-LEDs (130 of FIG. 2) are mixed as 3 μm in the −X axis direction and 4 μm in the +X axis direction defined in the drawing, as shown in FIG. 6C, in order that the third corner surface 218c is asymmetrical with the first corner surface 218a, the height h1 of the first corner 217a formed by the gathering of the first corner surface 218a and the third corner surface 218c is formed to be lowered by 3 μm, which is the arrangement error x of the micro-LED (130 of FIG. 2), along the length direction of the first corner surface 218a.

In addition, in order that the fourth corner surface 218d is asymmetrical with the second corner surface 218b, the height h2 of the second corner 217b formed by the gathering of the second corner surface 218b and the fourth corner surface 218d is formed to be lowered by 4 μm, which is the arrangement error x' of the micro-LED (130 of FIG. 2), along the length direction of the second corner surface 218b.

At this time, each of the first corner surface 218a and the second corner surface 218b is formed to have the base angle θ of 45° with the lower surface 212, but each of the third corner surface 218c and the fourth corner surface 218d is formed to have the base angle θ' greater than 45° with the lower surface 212, so that the first corner surface 218a and the third corner surface 218c are asymmetric to each other and the second corner surface 218b and the fourth corner surface 218d is also asymmetrical with each other.

The first inner bevel surface 213a and the second inner bevel surface 213b are also asymmetry with each other.

That is, in the optical cover window 200 according to the aspect of the present disclosure, the pyramid pattern 210 of the lens layer 203 may have various shapes corresponding to the arrangement error of the micro-LED (130 of FIG. 2) which occurs in the process of transferring the micro-LED (130 in FIG. 2). In this regard, when the arrangement error of the micro-LED (130 of FIG. 2) does not occur, the pyramid pattern 210 may be formed such that the four side surfaces 214 extend from the lower surface 212 to form one corner, as shown in FIG. 5A. In addition, when the arrangement error of the micro-LED (130 of FIG. 2) occurs, the heights h1 and h2 of the first and second corners 217a and 217b may be formed to be equal to each other corresponding to the range of the arrangement error x or x', as shown in FIGS. 5B, 6A and 6B.

In addition, when an arrangement error of the micro-LED (130 of FIG. 2) occurs, the heights h1 and h2 of the first corner 217a and the second corner 217b may be formed differently corresponding to the range of the arrangement error x or x', heights (h1, h2), as shown in FIG. 6C.

Here, in FIGS. 6A to 6C, only the first and second outer surfaces 211a and 211b, the first and second inner bevel surfaces 213a and 213b, and the first to fourth corner surfaces 218a, 218b, 218c and 218d are described. However, shapes of the fourth outer surface 211d and the fourth inner bevel surface 213d, which form the first corner 217a together with the first outer surface 211a and the first inner bevel surface 213a, are the same as those of the first outer surface 211a and the first inner bevel surface 213a, and shapes of the third outer surface 211c and the third inner bevel surface 213c are also the same as those of the second outer surface 211b and the second inner bevel surface 213b.

Figure 6D:
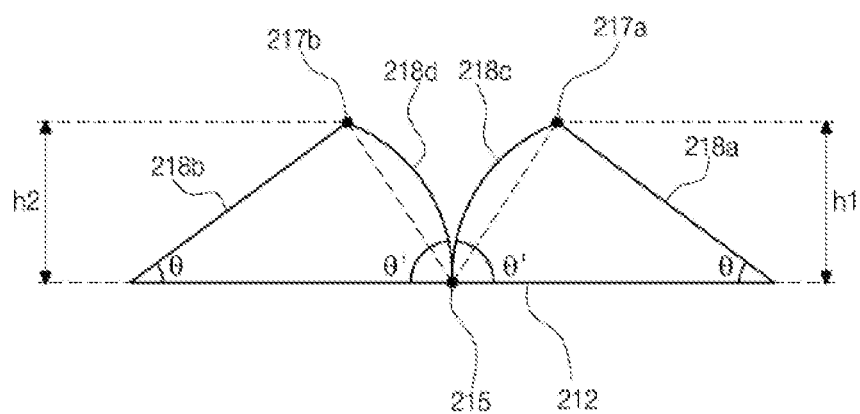
Figure 6E:
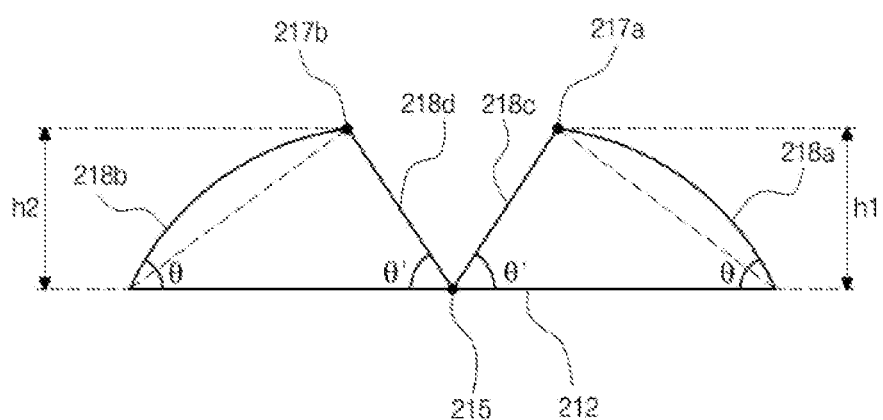

In addition, in the optical cover window 200 according to the aspect of the present disclosure, each of the inner bevel surfaces 213a, 213b, 213c and 213d of the pyramid pattern 210 of the lens layer 203 may be formed to have an outwardly convex curved surface, as shown in FIG. 6D, or each of the outer surfaces 211a, 211b, 211c and 211d may be formed to have an outwardly convex curved surface, as shown in FIG. 6E.

As such, when the outer surfaces 211a, 211b, 211c and 211d and/or the inner bevel surfaces 213a, 213b, 213c and 213d of the pyramid pattern 210 form a curved surface, vertical and horizontal viewing angles may be further increased.

Figure 6F:
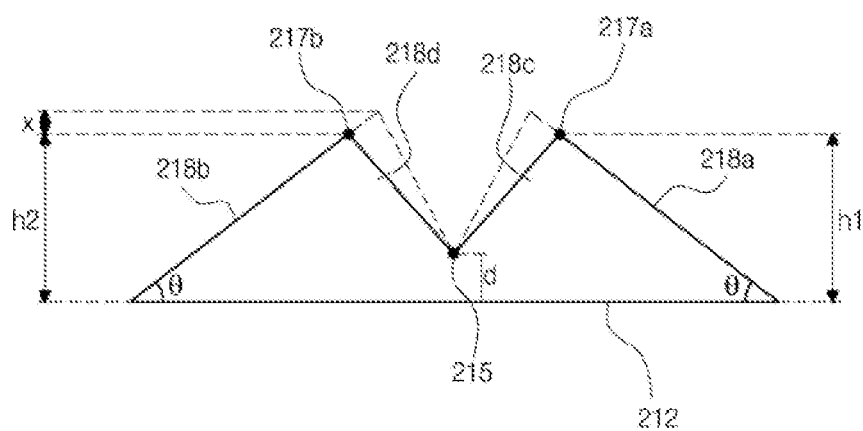

In addition, as shown in FIG. 6F, the central point corner 215 formed corresponding to the center portion of the lower surface 212 may be formed to be in close contact with the lower surface 212 or to be spaced apart from the lower surface 212 by the first interval d in correspondence to the range of the arrangement error of the micro-LED (130 of FIG. 2). The first interval d may be designed variously depending on the heights h1 and h2 of the first corner surface 218a and the second corner surface 218b and inclinations of the first to fourth corner surfaces 218a, 218b, 218c and 218d.

In the micro-LED display device (100 in FIG. 2) according to the aspect of the present disclosure, the high-transparency optical cover window 200 is positioned in front of the display panel (110 of FIG. 2) in correspondence to the transmission direction of a light emitted through the micro-LED (130 of FIG. 2) of the display panel (110 of FIG. 2), thereby protecting the display panel (110 of FIG. 2) and securing a beautiful appearance without visual distortion.

In particular, the lens layer 203 of the optical cover window 200 is formed with the pyramid pattern 210 including the inner bevel surfaces 213a, 213b, 213c and 213d corresponding to the range of the arrangement error x or x' of the micro-LED (130 of FIG. 2). Therefore, it is possible to prevent the central luminance decrease and viewing angle asymmetry of the micro-LED display device (100 of FIG. 2) from being caused according to the arrangement error x or x' of the micro-LED (130 of FIG. 2), and it is also possible to prevent a sharp decrease in luminance at a specific viewing angle.

Figure 7A:
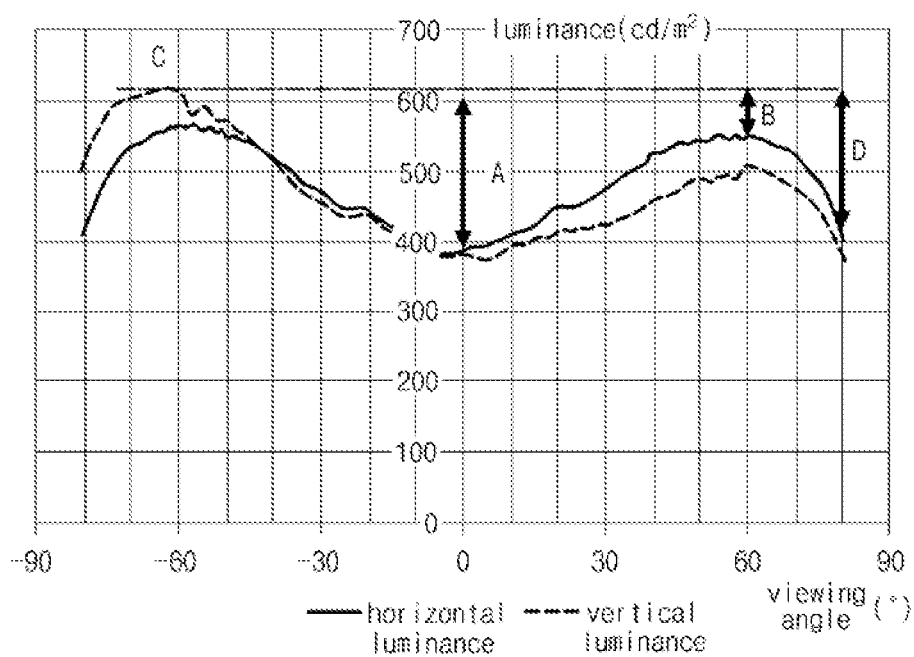
FIGS. 7A to 7B are simulation results for explaining effects of the present disclosure.
Figure 7B:
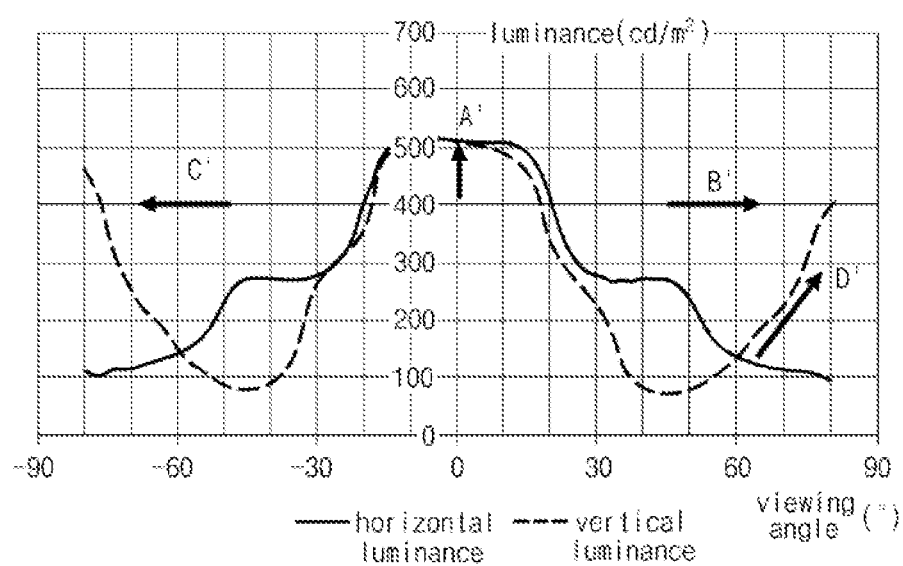

FIGS. 7A to 7B are simulation results for explaining effects of the present disclosure.

Here, FIG. 7A shows vertical (V) and horizontal (H) luminance distribution curves for viewing angles of a general micro-LED display device that is not provided with an optical cover window, and FIG. 7B shows vertical (V) and horizontal (H) luminance distribution curves for viewing angles of a micro-LED display device that is provided with an optical cover window according to an aspect of the present disclosure.

The vertical luminance means a luminance according to a up and down viewing angle of the micro-LED display device, and the horizontal luminance means a luminance according to a left and right viewing angle of the micro-LED display device.

Referring to the graph of FIG. 7A, in the general micro-LED display device, a central luminance corresponding to a region A is about 40% lower than a maximum luminance realized at a ±70°.

In addition, it is seen that a difference occurs between the vertical luminances of a region B and a region C at a viewing angle of ±70° that realizes the maximum luminance, and it is seen that the difference between the vertical luminances is about 10° or more.

This means that it has a left-right asymmetric structure, so that the symmetry of the viewing angle is broken, and this viewing angle asymmetry affects the viewing angle. That is, as a result, the viewing angle of the micro-LED display becomes narrow.

In addition, there is a problem in that a luminance uniformity is lowered because a hot band is generated in a region D.

Here, the hot band is a phenomenon in which a luminance is sharply lowered to be darkened or is sharply increased to be brightened in a constant half-maximum region so that bright and dark are clearly separated. Because of the hot band, light uniformity and display quality are lowered.

In the general micro-LED display device, it is seen that a sharp luminance decrease occurs at a viewing angle of 60 to 70° and the hot band is thus generated.

In contrast, in the micro-LED display device (100 of FIG. 2) according to the aspect of the present disclosure, the optical cover window 200 including the pyramid pattern 210 is positioned in front of the display panel (110 of FIG. 2). Therefore, a central luminance can be improved, an occurrence of viewing angle asymmetry can be prevented, and also a luminance being sharply lowered at a specific viewing angle can be prevented.

That is, referring to FIG. 7B, it is seen that the central luminance in a region A' is improved. It is seen that this center luminance is improved than the central luminance in the region A of FIG. 7A and is also improved compared to luminances in other viewing angles.

The central luminance may be defined as a front luminance. When the central luminance is improved, it can be determined that an overall luminance of the display device is improved, and thus a high-luminance display device recently required can be realized.

In addition, referring to FIG. 7B, it is seen that both the vertical and horizontal luminances of regions B' and C' are uniform. Accordingly, it is possible to prevent a problem of a viewing angle asymmetry being caused by left-right and up-down asymmetric structures.

In addition, it is seen that a sharp luminance decrease does not occur at a viewing angle of 60 to 70° of the D' region, and accordingly, a hot band is also prevented.

As described above, the micro-LED display device (100 in FIG. 2) according to the aspect of the present disclosure is characterized in that the high-transparency optical cover window 200 is positioned in front of the display panel (110 of FIG. 2) in correspondence to the transmission direction of a light emitted through the micro-LED (130 of FIG. 2) of the display panel (110 of FIG. 2). The optical cover window 200 has a high transparency to protect the display panel (110 in FIG. 2) and secure a beautiful appearance without visual distortion.

In particular, the lens layer 203 of the optical cover window 200 is formed with the pyramid pattern 210 including the inner bevel surfaces 213a, 213b, 213c and 213d corresponding to the range of the arrangement error x or x' of the micro-LED (130 of FIG. 2). Therefore, it is possible to prevent the central luminance decrease and viewing angle asymmetry of the micro-LED display device (100 of FIG. 2) from being caused according to the arrangement error of the micro-LED (130 of FIG. 2), and a sharp decrease in luminance can be prevented at a specific viewing angle.

Accordingly, the micro-LED display device having a uniform effect can be provided.

Although the aspects and advantages of the present disclosure have been described with respect to the LED display device, they are not limited thereto, but can be similarly applied to a general display device as long as the display device involves an arrangement error of the light emitting elements.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A light emitting diode display device, comprising:
a display panel including a light emitting diode for each sub-pixel defined on a substrate; and
an optical cover window positioned to correspond to a transmission direction of light emitted from the display panel and including a plurality of pyramid patterns;
wherein each of the plurality of pyramid patterns includes an inner bevel surface corresponding to an arrangement error of the light emitting diodes.

2. The light emitting diode display device of claim 1, wherein the arrangement error includes an average value of positioning errors in repeated arrangement of the light emitting diodes in a process of transferring the light emitting diodes onto the substrate.

3. The light emitting diode display device of claim 1, wherein each pyramid pattern includes a lower surface, and first to fourth outer surfaces extending from the lower surface to a top of each pyramid pattern.

4. The light emitting diode display device of claim 3, wherein the inner bevel surface includes first to fourth inner bevel surfaces respectively connected to the first to fourth outer surfaces to form a central point corner corresponding to a central portion of the lower surface.

5. The light emitting diode display device of claim 4, wherein the first inner bevel surface facing the first outer surface and the second inner bevel surface facing the second outer surface are positioned between the first outer surface and the second outer surface, and
wherein the third inner bevel surface facing the third outer surface and the fourth inner bevel surface facing the fourth outer surface are positioned between the third outer surface and the fourth outer surface.

6. The light emitting diode display device of claim 5, wherein the first outer surface, the fourth outer surface, the first inner bevel surface and the fourth inner bevel surface form a first corner,
wherein the second outer surface, the third outer surface, the second inner bevel surface and the third inner bevel surface form a second corner, and
wherein the first and second corners are located higher than the central point corner.

7. The light emitting diode display device of claim 6, wherein a first corner surface formed by a gathering of the first outer surface and the fourth outer surface and a third corner surface formed by a gathering of the first outer surface and the first inner bevel surface are asymmetric to each other by reflecting the arrangement error.

8. The light emitting diode display device of claim 7, wherein the second outer surface and the third outer surface are gathered to form a second corner surface, and the second outer surface and the second inner bevel surface are gathered to form a fourth corner surface, and
wherein the second corner surface and the fourth corner surface are asymmetric to each other by reflecting the arrangement error.

9. The light emitting diode display device of claim 8, wherein the first and second corner surfaces are symmetrical to each other, and the third and fourth corner surfaces are symmetrical to each other.

10. The light emitting diode display device of claim 9, wherein the first corner and the second corner have heights equal to each other.

11. The light emitting diode display device of claim 8, wherein the first and second corner surfaces are asymmetrical to each other, and the third and fourth corner surfaces are asymmetrical to each other.

12. The light emitting diode display device of claim 11, wherein the first corner and the second corner have heights different from each other.

13. The light emitting diode display device of claim 11, wherein the third corner surface is lowered by the arrangement error in a first direction, along a length direction of the first corner surface.

14. The light emitting diode display device of claim 13, wherein the fourth corner surface is lowered by the arrangement error in a second direction opposite to the first direction, along a length direction of the first corner surface.

15. The light emitting diode display device of claim 3, wherein each of the first to fourth outer surfaces has an outwardly convex curved surface.

16. The light emitting diode display device of claim 6, wherein each of the first to fourth inner bevel surfaces has an outwardly convex curved surface.

17. The light emitting diode display device of claim 1, wherein the optical cover window has a thickness of 20 μm~80 μm and has a refractive index of 1.0 or higher and 1.54 or lower, and
wherein the pyramid pattern has a size of 25 μm to 50 μm.

18. The light emitting diode display device of claim 1, wherein the light emitting diode includes a first semiconductor layer, an n-type electrode positioned on a side of the first semiconductor layer, an active layer positioned on the first semiconductor layer, a second semiconductor layer positioned on the active layer, and a p-type electrode positioned on the second semiconductor layer, and
wherein the p-type electrode is connected to a driving thin film transistor positioned on the substrate.

19. A display device, comprising:
a display panel including a plurality of light emitting elements; and
a lens layer covering the display panel, including a plurality of pyramid lenses and disposed in a transmission direction of a light emitted from the display panel,
wherein each of the plurality of pyramid lenses includes an inner bevel surface corresponding to an arrangement error of the light emitting elements.

20. The display device of claim 19, wherein each of the pyramid lenses overlaps with only a portion of one corresponding light emitting element of the plurality of light emitting elements and occupiers a smaller area than the one corresponding light emitting element.

* * * * *